United States Patent [19]

Sakui

[11] Patent Number: 4,628,486
[45] Date of Patent: Dec. 9, 1986

[54] MOS DYNAMIC RANDOM ACCESS MEMORY

[75] Inventor: Koji Sakui, Kawasaki, Japan

[73] Assignee: Kabushiki Kaisha Toshiba, Kawasaki, Japan

[21] Appl. No.: 681,024

[22] Filed: Dec. 13, 1984

[30] Foreign Application Priority Data

Mar. 31, 1984 [JP] Japan .................................. 59-63533

[51] Int. Cl.$^4$ ........................ G11C 11/24; G11C 8/00
[52] U.S. Cl. .................................... 365/149; 365/230
[58] Field of Search ............... 365/149, 174, 189, 178; 357/23.6; 307/449, 463

[56] References Cited

U.S. PATENT DOCUMENTS 3,387,286 6/1968 Mitake et al. .................... 365/174
3,986,180 10/1976 Cade ............................... 365/149
4,298,960 11/1981 Dennard .......................... 365/149

FOREIGN PATENT DOCUMENTS 0111879 7/1982 Japan ............................ 365/149
57-34597 7/1982 Japan .

Primary Examiner—Stuart N. Hecker
Assistant Examiner—Glenn A. Gossage
Attorney, Agent, or Firm—Oblon, Fisher, Spivak, McClelland, & Maier

[57] ABSTRACT

In a MOS-dRAM formed by integrating memory cells each formed of an MOS capacitor and an MOSFET, a D-type transistor with a threshold voltage lower than that of MOSFETs of peripheral circuits is used for the MOSFET of each memory cell. Thus, a word line driver without a pull-up circuit can be used, permitting high-speed access of the MOS-dRAM.

1 Claim, 5 Drawing Figures

F I G. 1
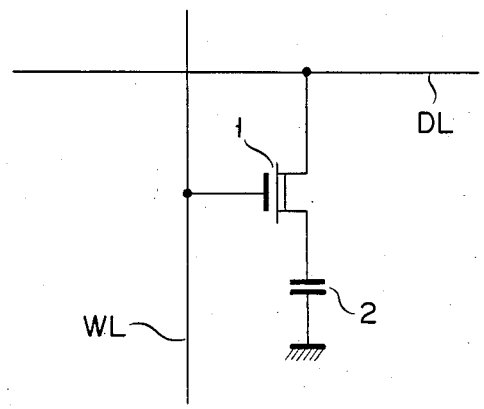
F I G. 2
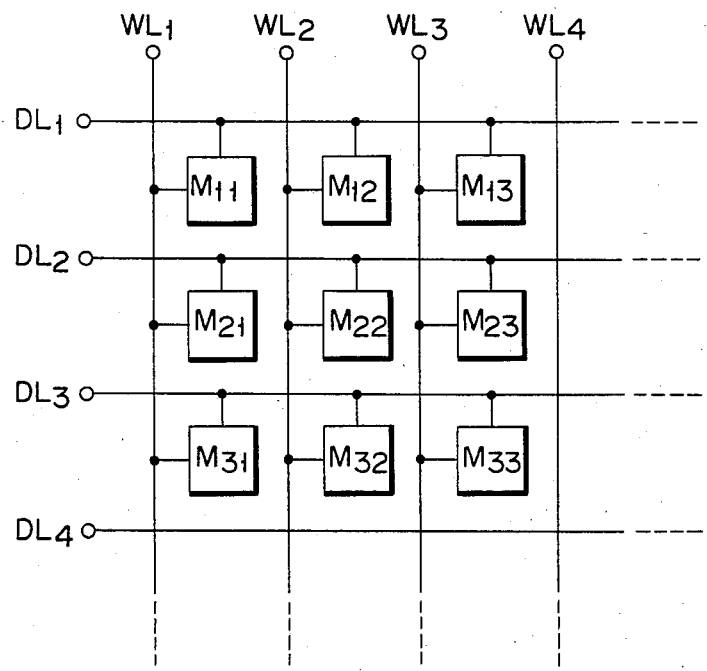

MOS DYNAMIC RANDOM ACCESS MEMORY

BACKGROUND OF THE INVENTION

The present invention relates to a semiconductor memory device, and more specifically to an MOS-dRAM (MOS-dynamic random access memory) formed by integrating a plurality of memory cells each including an MOSFET and a memory capacitor.

In general, a MOS-dRAM uses memory cells which are each formed of a single MOSFET and a single memory capacitor. A MOS capacitor is conventionally used for the memory capacitor. The MOS-dRAM includes a memory array in which a plurality of memory cells is integrated into a matrix form on a semiconductor substrate. The memory array is provided with a plurality of word lines arranged along each column and a plurality of digit lines arranged along each row. The gates of the MOSFETs of a plurality of memory cells arranged along each word line are connected in common to the word line, while the drains of the MOSFETs of a plurality of memory cells arranged along each digit line are connected in common to the digit line.

Conventionally, the MOSFETs of the memory cells used in such a MOS-dRAM are n-channel, E-type MOSFETs. The memory capacitor is supplied at one end with a source supply voltage $V_{SS}$ (normally at zero volt) or drain supply voltage $V_{DD}$ (normally at 5 volts). In writing data in the memory capacitor to be stored therein from a digit line or in reading data stored in the memory capacitor onto the digit line, a selected word line is supplied with a voltage, e.g., at 7.5 volts, which is about 1.5 times as high as the drain supply voltage $V_{DD}$. By doing this, the read or write efficiency of data stored in the form of electric charges in the memory capacitor is raised to 100 percent. If the voltage applied to the word line is equal to the drain supply voltage $V_{DD}$, the potential at the node of the memory capacitor connected to the source of the MOSFET of the memory cell can be raised only up to $V_{DD}-V_{th}$ ($V_{th}$ is the threshold voltage of MOSFET). Therefore, even if writing is executed with the drain supply voltage $V_{DD}$ applied to the digit line, the written voltage cannot become higher than $V_{DD}-V_{th}$. In reading data stored in the memory capacitor onto the digit line, stored electric charges cannot be read out to 100 percent unless the word line is supplied with a sufficiently high voltage.

In reading or writing data, moreover, the variation of the conductance of the MOSFETs of the memory cells influences access time. If the voltage applied to the word line is increased, the conductance of the MOSFETs becomes greater, and the reading or writing speed is increased.

For these reasons, the voltage applied to the word line during an active period, in the prior art MOS-dRAM, is as high as about 7.5 volts.

The prior art MOS-dRAM, however, has the following problems. First, it takes time to pull up the voltage applied to the word line to be 1.5 times as high as the drain supply voltage $V_{DD}$, resulting in longer access time. Namely, in a conventional clock generator using no pull-up circuit, the clock output rises up to the drain supply voltage $V_{DD}$ in a rise time of about 3 nsec. On the other hand, a clock generator adapted to drive the word lines is provided with a pull-up circuit. In this clock generator, therefore, a rise time of 10 nsec or more is needed for the clock output of 7.5 volts. Secondly, MOSFETs constituting the pull-up circuit are not perfectly reliable. In the MOSFETs used in this circuit, the drain-source voltage may sometimes exceed 7.5 volts, possibly causing punch-through or impact ionization attributed to intense electric fields near the drain. This leads to an increase in substrate current. Moreover, a number of hot carriers will be generated and injected into the gate oxide film of the MOSFETs to be trapped therein, causing fluctuations in the threshold voltage of the MOSFETs. To avoid these phenomena, it is necessary to use MOSFETs with a long channel length for the MOSFETs whose drain-source voltage is high. This leads to a third problem, that is, an increase in power consumption and in the space of the MOS-dRAM.

Besides the above problems, the MOSFETs of the memory cells are subject to the following drawbacks. For a higher degree of IC integration, it is basically necessary to reduce the size of elements constituting a circuit. In the MOS-dRAM, in particular, the channel length of the MOSFETs constituting the memory cells needs be shortened. It is generally known that as the channel length of the MOSFETs becomes shorter, what is called a short-channel effect is produced, lowering the threshold voltage. Thus, if the threshold voltage of the MOSFETs is lowered with the reduction of the channel length, the subthreshold current will increase, making the electric charges or information data stored in the memory capacitor liable to erasure. Conventionally, this problem is settled by increasing the surface impurity concentration of the channel regions of the MOSFETs of the memory cells by ion implantation to raise the threshold voltage of the MOSFETs. If the threshold voltage of the MOSFETs is increased, however, the aforesaid read or write efficiency can be improved only by further increasing the driving voltage for the word lines.

In the prior art MOS-dRAM, moreover, the potential of the nonselected word lines is adjusted to the source supply voltage $V_{SS}=0$ volt. Thus, in the prior art device in which the threshold voltage of the MOSFETs of the memory cells is low, data stored in the memory cells could be erased by noise or capacitive coupling between the selected word line and nonselected word lines.

SUMMARY OF THE INVENTION

The object of the present invention is to provide a MOS-dRAM of high reliability, obviating the necessity of a pull-up circuit for the word line driver and permitting the reading and writing of data in a shorter access time.

According to the present invention, MOSFETs constituting memory cells of a MOS-dRAM whose channel regions are doped with impurities of the conductivity type opposite to that of the substrate. In other words, the MOSFETs used in the memory cells are either D-type MOSFETs or E-type MOSFETS closely resembling the D-type whose threshold voltage is lower than that of the E-type ones used in peripheral circuits.

Since the D-type or the E-type MOSFETS resembling the same are used for the MOSFETs in the memory cells, according to the invention, the word line driver delivers a first-polarity voltage $V_H$ to one selected word line and a second-polarity voltage $V_L$ to the remaining nonselected word lines. Here the first-polarity output voltage need not be one which is pulled up above the drain supply voltage $V_{DD}$. The second-polarity output voltage VL is needed in order to keep the MOSFETs of the memory cells connected to the nonselected word lines in an off state. If the threshold voltage of the MOSFETs of the memory cells is Vth, then the second-polarity voltage $V_L$ should preferably be selected such that the relation:

$$|V_L| \geq |Vth| + 1$$

is established.

BRIEF DESCRIPTION OF THE DRAWINGS

FIG. 1 shows an equivalent circuit of a memory cell in a MOS-dRAM according to one embodiment of the present invention;

FIG. 2 shows an equivalent circuit of a memory array of the MOS-dRAM;

DETAILED DESCRIPTION OF THE PREFERRED EMBODIMENT

An n-channel MOS-dRAM using a p-type Si substrate according to one embodiment of the present invention will now be described in detail.

As shown in FIG. 1, a memory cell is formed of an n-channel MOSFET 1 and an MOS capacitor 2. One end of the MOS capacitor 2 is set to a source supply voltage $V_{SS}$ (=0 volt) as a reference potential, while the other end is connected to the source of the MOSFET 1. Instead of using the source supply voltage $V_{SS}$, a drain supply voltage $V_{DD}$ (=5 volts) may sometimes be used as the reference potential of the MOS capacitor 2. The MOSFET 1 is a D-type MOSFET whose threshold voltage Vth is about −1.5 volts. The gate and drain of the MOSFET 1 are connected to a word line WL and a digit line DL, respectively.

FIG. 2 shows an equivalent circuit of a memory array in which a plurality of such memory cells Mij is arranged in the form of a matrix. A word line WLj extends along each column of the matrix, and a digit line DLi along each row. Namely, the gates of the respective MOSFETs of a plurality of memory cells arranged along each column are connected in common to each corresponding word line. Likewise, the drains of the respective MOSFETs of the memory cells along each row are connected in common to each corresponding digit line.

In this embodiment, $V_H = V_{DD} - 2Vth$ approximate to the drain supply voltage $V_{DD}$ (=5 volts) is applied as a first-polarity voltage $V_H$ to a word line WL which is selected for reading or writing. Here Vth is the threshold voltage of MOSFETs used in peripheral circuits independent of the memory cells, taking a value in the vicinity of 0.6 volt. A substrate bias voltage $V_L = V_{BB}$ (=−3 volts) delivered from a back-gate bias circuit is applied as a second-polarity voltage $V_L$ to nonselected word lines WL.

Figure 3:
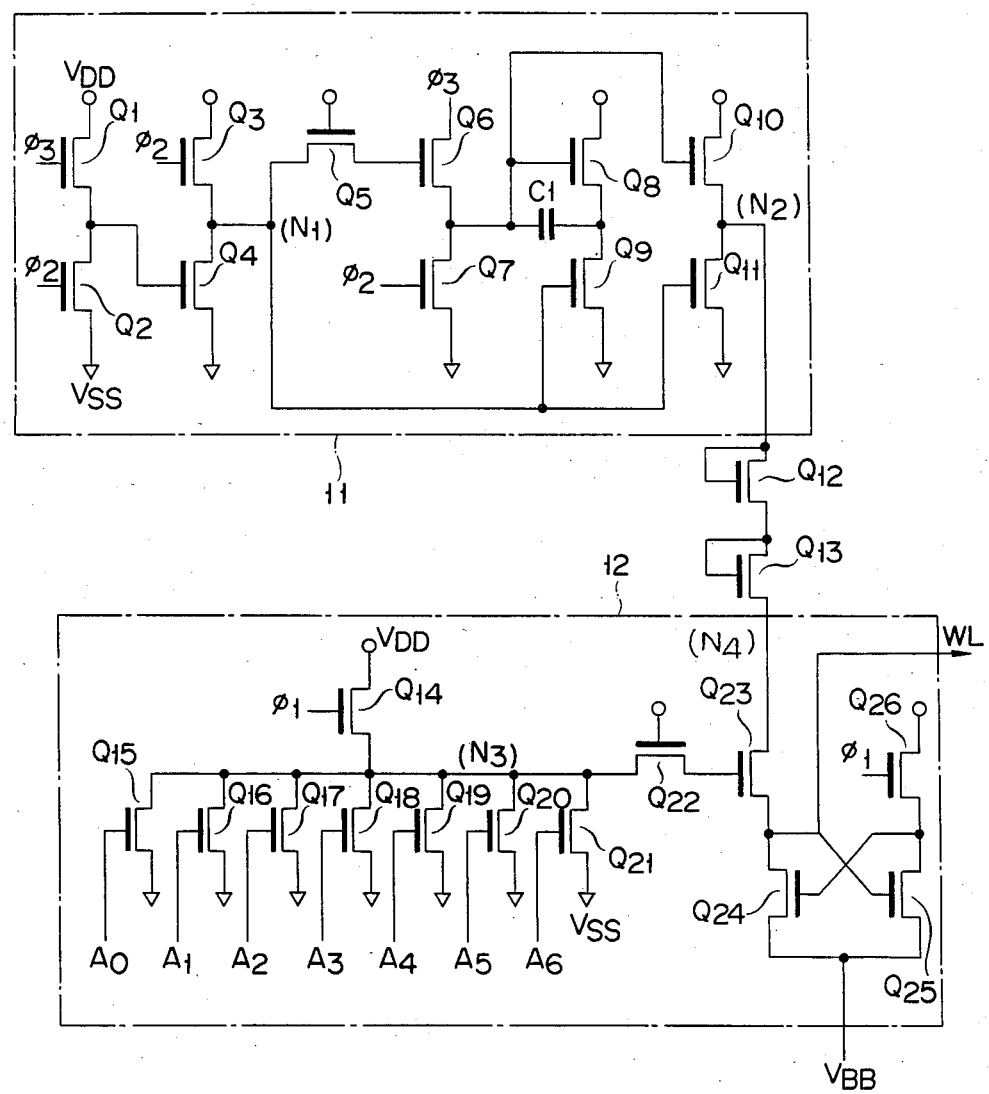
FIG. 3 shows a word line driver of the MOS-dRAM.

FIG. 3 shows a word line driver which drives the word lines WL using the above-mentioned voltages. The word line driver is formed of a decoder 12 and a clock generator 11 for controlling the operating timing of the decoder 12. The clock generator 11 is well-known in the art. The basic arrangement of the decoder 12 is also well-known in the art. MOSFETs Q1 to Q26 used in the word line driver are E-type MOSFETs whose threshold voltage Vth is about 0.6 volt. The word line driver, which is controlled by clock signals $\phi 1$, $\phi 2$ and $\phi 3$, selectively supplies a driving voltage to the word lines WL designated by internal address signals A0 to A6 which are delivered from an address buffer (not shown). The decoder 12 does not include such a pull-up circuit as is used in a prior art decoder. The substrate bias voltage $V_{BB}$ (=−3 volts) delivered from the back-gate bias circuit (mentioned later) is used as the reference potential of an output buffer which is formed of the MOSFETs Q23, Q24, Q25 and 026. The MOSFETs Q12 and Q13 connected between the clock generator 11 and the decoder 12 constitute a level shift circuit for preventing the MOSFET Q10 in the output stage of the clock generator 11 from being turned on while the voltage $V_{BB}$ is being supplied to the nonselected word lines $W_L$.

The word line driver supplies one selected word line with $V_H = V_{DD} - 2Vth$ as the first-polarity voltage, and the remaining nonselected word lines with $V_L = V_{BB}$ as the second-polarity voltage.

Figure 4:
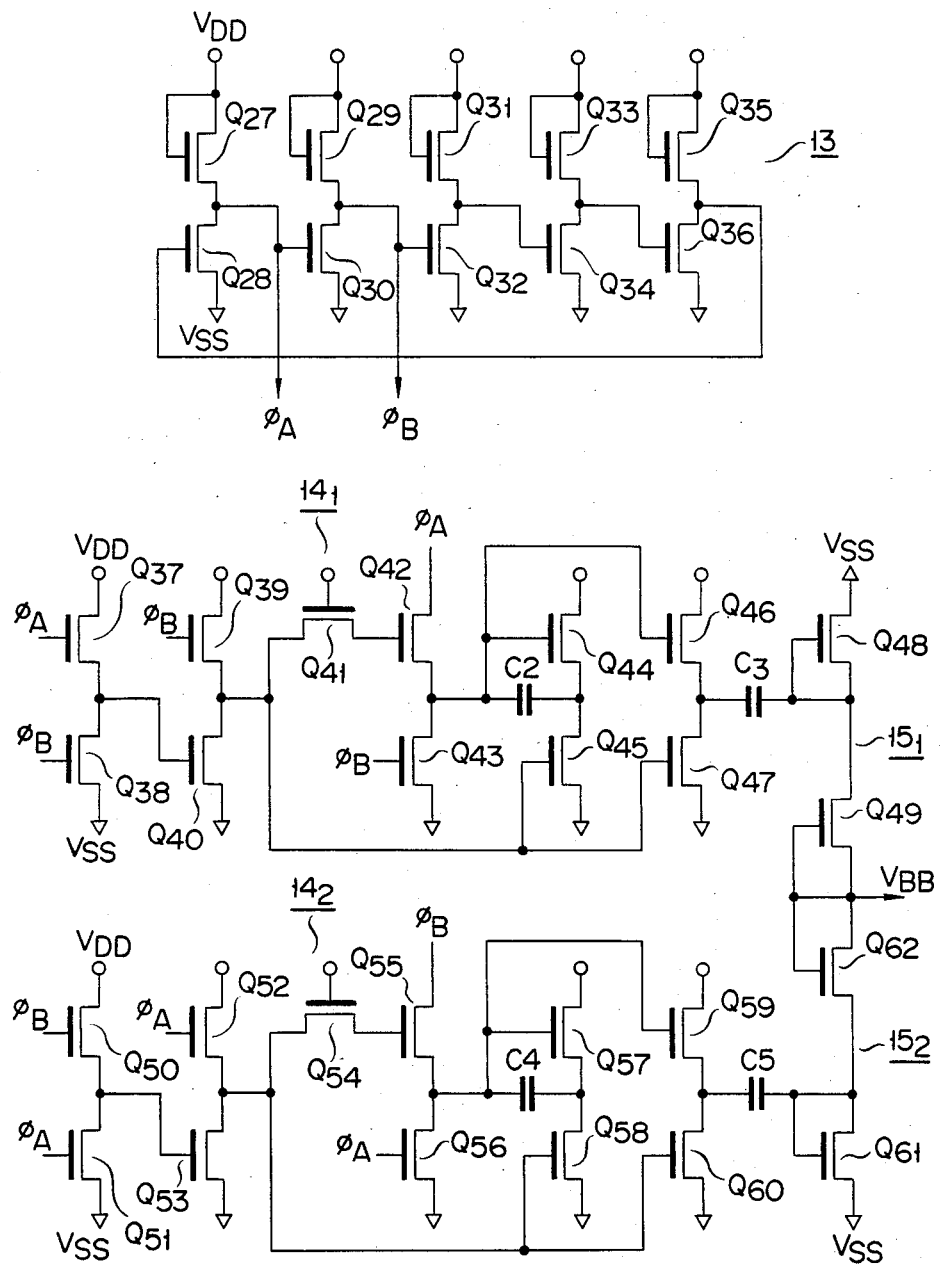
FIG. 4 shows a back-gate bias circuit of the MOS-dRAM.

FIG. 4 shows the back-gate bias circuit which generates the substrate bias voltage $V_{BB}$. This circuit includes a ring oscillator 13 formed of a plurality of cascade-connected MOS inverters, clock generators $14_1$ and $14_2$ driven by clocks $\phi A$ and $\phi B$ of opposite phases delivered from the ring oscillator 13, and charge pumping circuits $15_1$ and $15_2$ driven by the clock generators $14_1$ and $14_2$. All of the MOSFETs Q27 to Q62 used in this circuit are also E-type MOSFETs whose threshold voltage is about 0.6 V. The back-gate bias circuit is well-known in the art. The substrate bias voltage $V_{BB}$ as the output of the back-gate bias circuit is applied to the sources of the output buffer MOSFETs Q24 and Q25 of the decoder 12 shown in FIG. 3.

More specifically, the memory array and its peripheral circuits described above are integrated on, for example, a p-type Si substrate with a resistivity of 20 Ω·cm. In the MOSFETs used in the peripheral circuits shown in FIGS. 3 and 4, the channel region is implanted with boron ions B+, and the gate oxide film is 200 Å in thickness. As a result, the MOSFETs acquire the threshold voltage of about +0.6 volts when supplied with the substrate bias voltage $V_{BB}$ (=−3 volts).

In the MOSFETs in the memory array, on the other hand, the channel region is implanted with phosphorus ions P+ or arsenic ions As+ as impurities whereby the channel region has a conductivity type opposite that of the substrate. As regards As+, for example, ion implantation is performed at a dose rate of $5 \times 10^{11}/cm^2$ and with acceleration energy of 50 keV. The gate oxide film thickness, like that of the MOSFETs in the peripheral circuits, is 200Å. Thus, the MOSFETs in the memory array are D-type MOSFETs whose threshold voltage Vth is about −1.5 volts.

Figure 5:
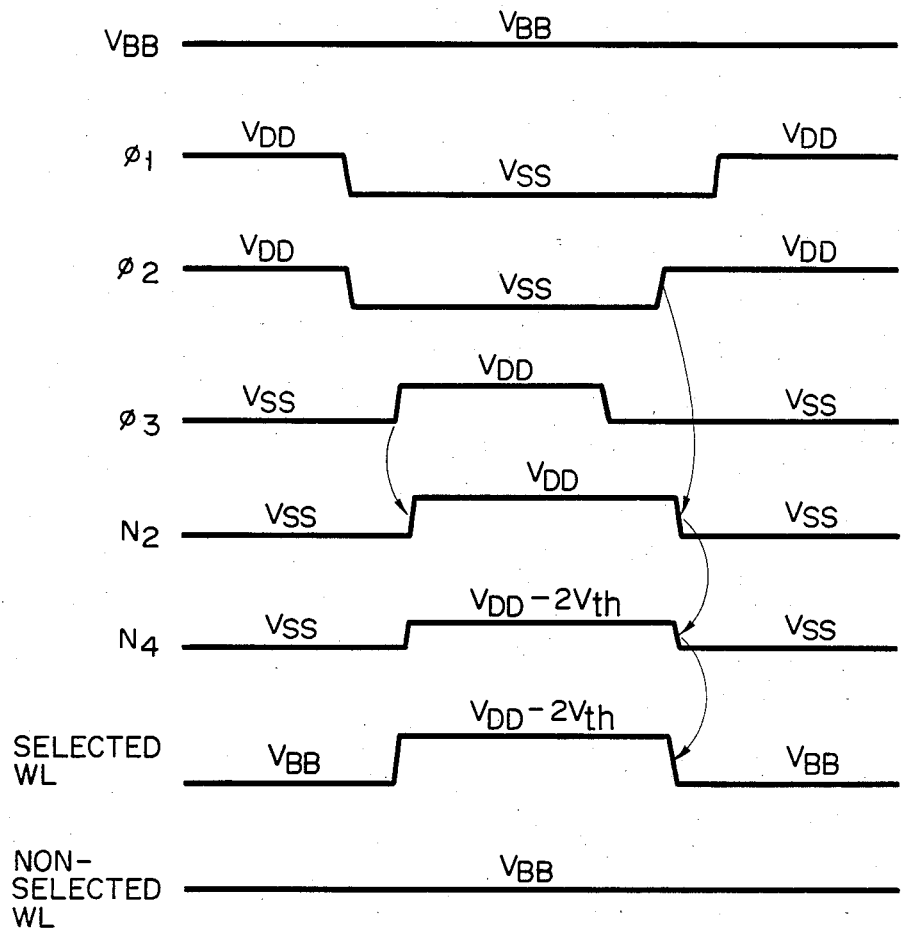
FIG. 5 shows signal waveforms for illustrating the operation of the MOS-dRAM.

Referring now to FIG. 5, the operation of the MOS-dRAM constructed in this manner will be described. When the drain supply voltage $V_{DD}$ (=5 volts) and the source supply voltage VSS (=0 volt) are applied, the back-gate bias circuit is actuated to deliver $V_{BB} = -(V_{DD} - 2Vth)$ (=−3 volts). During precharging, the clock signals $\phi 1$ and $\phi 2$ are at $V_{DD} = 5$ volts. In the meantime, a node N1 of the clock generator 11 and a node N3 of the decoder 12 are precharged to have a potential at $V_{DD} - Vth \approx 4$ volts. The potentials of an output node N2 of the clock generator 11 and a node N4 of the decoder 12 are both set to $V_{SS}$. At this time, the MOSFETs Q24 and Q26 in the output stage of the decoder 12 are on, so that the word lines WL are supplied with the second-polarity voltage $V_L = V_{BB} (= -3$ volts).

When the clock signals $\phi 1$ and $\phi 2$ are changed from $V_{DD}$ to $V_{SS}$ and enter active time, the internal address signals A0 to A6 are delivered from the address buffer. One decoder is selected in accordance with the address signals A0 to A6. If all the signals A0 to A6 are "L" in the circuit of FIG. 3, the MOSFETs Q15 to Q21 are all off, and the potential of the node N3 is kept at about 4.4 volts. In this state, when the clock signal $\phi 3$ is changed from $V_{SS}$ to $V_{DD}$, the potential of the output node N2 of the clock generator 11 becomes $V_{DD}$, while that of the node N4 of the decoder 12 becomes $V_{DD} - 2V$th. Thus, the decoder 12 is selected, and the first-polarity (positive) voltage $V_H = V_{DD} - 2V$th ($\approx 4$ volts) is supplied to the word line WL through the MOSFET Q23 which is on. In the memory cell connected to the word line WL selected in this manner, the MOSFET is turned on, and reading or writing of data is executed. In the meantime, the remaining nonselected word lines are supplied with the second-polarity (negative) voltage $V_L = V_{BB} (= -3$ volts).

According to the present invention, as described above, the use of the D-type MOSFETs in the memory cells obviates the necessity of the pull-up circuit which is required in the prior art word line driver. As a result, the time conventionally required for pulling up the word lines becomes unnecessary, so that the access time can be shortened by 10 nsec or more. In the word line driver, moreover, punch-through of the MOSFETs and generation of hot electrons are restrained to improve the reliability of the MOS-dRAM. Furthermore, the peripheral circuits require less power consumption and less space.

To prevent erasure of data in the nonselected memory cells, according to the present invention, the nonselected word lines require a voltage opposite in polarity to the drain supply voltage. This requirement may be fulfilled by the use of the back-gate bias circuit, as described in connection with the above embodiment. Namely, the back-gate bias circuit is indispensable to the memory device of this type. The use of the back-gate bias circuit obviates the necessity of another negative voltage generating circuit. Since a number of nonselected word lines are connected to the output terminal of the back-gate bias circuit, the load of the back-gate bias circuit is increased. In consequence, the substrate bias voltage is reduced in fluctuations, that is, stabilized. Further, the capacity of all the word lines is great, so that the voltage $V_{DD} - V$th of the selected word line is lowered to $V_{BB}$ in a short time.

In the MOSFET of each memory cell, which is of the D-type according to the present invention, a reverse bias is applied between its gate and source when the memory cell is among the nonselected ones. Therefore, this MOSFET can have a short channel length. Thus, the memory cell can be reduced in area, permitting large-scale integration of the MOS-dRAM. Since the MOSFETs of the memory cells are biased in the reverse direction, stored data is securely prevented from being erased by noise or capacitive coupling.

The present invention is not limited to the embodiment described above, and the following various modifications may be effected therein.

(a) In FIG. 3, the nodes N2 and N4 may be directly connected without using the MOSFETs Q12 and Q13. In this case, it is necessary to set the threshold voltage of the MOSFET Q10 in the output stage of the clock generator to a higher level.

(b) The clock generator 11 may be of any other configuration, provided its output voltage is $V_{DD} - V$th in an active cycle.

(c) The output of a negative voltage generating circuit independent of the back-gate bias circuit may be used as the reference potential of the output stage of the decoder 12.

(d) The MOSFETs of the memory cells need not always be of the D-type. They may alternatively be E-type ones which closely resemble D-type ones. It is necessary only that the channel regions of the MOSFETs of the memory cells be doped with impurities by ion implantation or other method so that their threshold voltage is lower than that of the MOSFETs in the peripheral circuits. Also, it is necessary that the relation:

$$|V_L| \geq |Vth| + 1$$

be established where Vth is the threshold voltage of the MOSFETs of the memory cells and $V_L$ is the second-polarity voltage applied to the nonselected word lines.

(e) The present invention may also be applied to a p-channel MOS-dRAM. The peripheral circuits may be also of a CMOS configuration.

What is claimed is:

1. A MOS-dynamic random access memory, comprising:
   a semiconductor substrate;
   a memory array formed of a plurality of memory cells arranged in a matrix on the substrate, each of said memory cells including a memory capacitor and a switching MOSFET having a gate, a source, a drain, and a channel region doped with impurities of a conductivity type opposite to that of the substrate;
   a plurality of word lines formed on the substrate each connected in common with the gates of the switching MOSFETs of a plurality of said memory cells arranged along each corresponding row of said memory array;
   a decoder formed on the substrate for selectively driving said plurality of word lines, including an output MOSFET and a flip-flop connected to the source of the output MOSFET, wherein a substrate bias voltage delivered from a back-gate bias circuit is used as a reference potential of said flip-flop;
   a clock generator formed on the substrate for controlling the operating timing of the decoder; and
   a level shift circuit formed on the substrate connected between an output of said clock generator and the drain of the output MOSFET of said decoder.

* * * * *

UNITED STATES PATENT AND TRADEMARK OFFICE
CERTIFICATE OF CORRECTION

PATENT NO. : 4,628,486

DATED : DECEMBER 9, 1986

INVENTOR(S) : KOJI SAKUI

It is certified that error appears in the above-identified patent and that said Letters Patent is hereby corrected as shown below:

Claim 1, line 14, change "row" to --column--.

Signed and Sealed this

First Day of November, 1988

Attest:

DONALD J. QUIGG

*Attesting Officer*  *Commissioner of Patents and Trademarks*